United States Patent
Neti et al.

(10) Patent No.: US 10,345,419 B2
(45) Date of Patent: Jul. 9, 2019

(54) ON-LINE CALIBRATION AND COMPENSATION OF A CURRENT TRANSFORMER

(71) Applicant: General Electric Company, Schenectady, NY (US)

(72) Inventors: Prabhakar Neti, Rexford, NY (US); Karim Younsi, Balston Lake, NY (US); Dan Tho Lu, Minden, NV (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 362 days.

(21) Appl. No.: 14/977,103

(22) Filed: Dec. 21, 2015

(65) Prior Publication Data

US 2017/0176567 A1    Jun. 22, 2017

(51) Int. Cl.
*G01R 15/18*     (2006.01)
*G01R 35/00*     (2006.01)
*G01R 19/00*     (2006.01)

(52) U.S. Cl.
CPC .......... *G01R 35/005* (2013.01); *G01R 15/18* (2013.01); *G01R 19/0092* (2013.01); *G01R 35/00* (2013.01)

(58) Field of Classification Search
CPC .... G01R 19/0092; G01R 15/18; G01R 15/20; G01R 15/148; G01R 15/183; G01R 15/207; G01R 19/20; G01R 33/02; G01R 33/09; G01R 19/00; G01R 35/00; G01R 35/005; H01F 38/28; H01F 38/32
See application file for complete search history.

(56) References Cited

U.S. PATENT DOCUMENTS

| | | |
|---|---|---|
| 8,217,644 B2 | 7/2012 | Younsi et al. |
| 8,421,442 B2 | 4/2013 | Younsi et al. |
| 8,502,554 B2 | 8/2013 | Wilson et al. |
| 2010/0315095 A1 | 12/2010 | Younsi et al. |

FOREIGN PATENT DOCUMENTS

| | | |
|---|---|---|
| CN | 101726715 A | 6/2010 |
| CN | 202256656 U | 5/2012 |
| CN | 202886585 U | 4/2013 |
| CN | 103293507 A | 9/2013 |
| CN | 204129206 U | 1/2015 |

(Continued)

OTHER PUBLICATIONS

Tam, "Current-Transformer Phase-Shift Compensation and Calibration", Texas instruments Application Report, pp. 1-6, Feb. 2001.

(Continued)

*Primary Examiner* — Son T Le
(74) *Attorney, Agent, or Firm* — Mintz Levin Cohn Ferris Glovsky and Popeo, P.C.

(57) ABSTRACT

Systems and methods are disclosed for calibration and compensation of on-line current transformers. In certain embodiments, a method to calibrate a single current transformer by use of an AC injected current is provided. In other embodiments, a method to calibrate and compensate multiple current transformers using a single AC injected current is provided. In further embodiments, a system for calibration and compensation of multiple current transformers is provided. The adequate frequency of the injected current as well as other characteristics for adequate use in some embodiments is provided.

13 Claims, 7 Drawing Sheets

(56) References Cited

FOREIGN PATENT DOCUMENTS

WO    2015/051983 A1    4/2015

OTHER PUBLICATIONS

Zhang et al., "Online Calibration of MOSFET On-State Resistance for Precise Current Sensing", Power Electronics Letters, IEEE, vol. 2, Issue 3, pp. 100-103, Sep. 2004.

Gallo et al., "Compensation of Current Transformers by means of Field Programmable Gate Array", Metrology and Measurement Systems, pp. 1-10, 2009.

Draxler et al., "Using a Current Loop and Homogeneous Primary Winding for Calibrating a Current Transformer", Instrumentation and Measurement, IEEE Transactions, vol. 62, issue 6, pp. 1658-1663, Dec. 11, 2012.

Extended European Search Report and Opinion issued in connection with corresponding EP Application No. 16203087.8 dated May 15, 2017.

ON-LINE CALIBRATION AND COMPENSATION OF A CURRENT TRANSFORMER

BACKGROUND

The subject matter disclosed herein relates to systems and methods for on-line calibration and compensation of current transformers.

Current transformers are devices capable of sensing changes in the current flowing through a cable or a collection of cables and producing voltage proportional to that variation. When an alternating current is measured, the output voltage from the current transformer is proportional to the amplitude of that current. As such, in alternating current applications, current transformers can be used as current sensors. Proper calibration of a current transformer allows it to be used as a quantitative sensor.

Due to changes in the material from natural usage or from environmental conditions, the gains identified during calibration may change over time. As a result, to maintain accuracy as a quantitative sensor and to allow compensation based on measurements derived from the current transformer, subsequent calibrations may be periodically required. However, such calibrations typically require equipment downtime, which may be undesirable and/or expensive in an operational environment where equipment uptime is desired.

BRIEF DESCRIPTION

In one embodiment, a method to calibrate a current transformer while on-line is provided. In accordance with this method, voltage data is measured from a current transformer through which a first current at a first frequency and a second current at a second frequency flows. The second frequency differs from the first frequency. At least two spectral components present in the voltage data are separated. A first spectral component $V_{OL}$ associated with the first frequency is determined. A second spectral component $V_{OC}$ associated with the second frequency is determined. A gain for the current transformer is calibrated from the known injected current and the $V_{OC}$.

In another embodiment, a method to calibrate and compensate multiple on-line current transformers is provided. In accordance with this method, voltage data is measured from a first current transformer through which a first AC load current at a first frequency and an AC injected current at a second frequency flows. Voltage data is also measured from a second current transformer through which a second AC load current at a third frequency and the AC injected current at the second frequency flows. The first and the third frequencies may be identical and are distinct from the second frequency. The voltage data is separated into spectral components. An injected current spectral component $V_{OC}$ associated with the second frequency is determined. A first spectral component based on the first frequency is determined. A second spectral component based on the second frequency is determined. A gain from the known AC injected current and the $V_{OC}$ is determined. One or both of the first AC load current or the second AC load current measurements are compensated based at least on the calibrated gain.

In a further embodiment, an on-line current transformer calibration and compensation system is provided. The system comprises: a current injection system; at least one current transformer comprising at least one sense coil; an AC current cable running through the at least one current transformer and configured to carry at least an AC injected current generated by the current injection system; and; an electronic device connected to the at least one sense coil in the at least one current transformer, wherein the electronic device is configured or programmed to: record voltage data induced in the current transformer; separate spectral components of the voltage data; and calibrate a gain of the at least one current transformer.

The methods and the systems described herein enables calibration and compensation of on-line current transformers. This capability allows for continuous use of current transformers as current sensors, without the need of an equipment downtime, increasing thus the feasibility of this measurement strategy.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decision must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Current transformers are devices capable of sensing changes in current flowing through a conductor and producing a voltage proportional to that variation. A cable being measured carries a time-varying electric current which induces a time-varying magnetic field in the magnetic core of the current transformer. In turn, variations in the magnetic field produce an output voltage in the terminals of a sense coil wound around the magnetic core. When an alternating current is being measured, the output voltage from the current transformer is proportional to the amplitude of the current. In a calibrated current transformer, the gain, i.e., the ratio between measured current and output voltage, is known. As such, in alternating current applications, current transformers can be used as a device to measure AC currents.

Changes in the material or in the environment over time may affect the gain relationship initially established during calibration. This results in loss of accuracy of the current transformer in the role of an AC current measurement device. A standard calibration protocol can be employed to update the value of the gain, but conventional calibration protocols involve shutdown of the measured device or, at the very least, disassembly of the measurement unit.

Implementations described herein allow for calibration of a current transformer while the current transformer is measuring an AC current, i.e., in operation or "on-line". In order to do so, an additional AC current is injected through the current transformer. The frequency of this current is distinct from the frequency of the measured AC current. Due to superposition, the output voltage from the current transformer is a combination of the two voltages induced by the measured and the additional injected current. This combination can be separated into its components by electronic devices employing spectral methods. These separated components, one of which is associated with the known injected current" can then be used for on-line calibration of the current transformer and or for establishing compensation strategies. Compensation strategies, in some implementations, take into account the changes in gain as a function of the signal frequency.

Some aspects of the implementations described herein address the calibration of multiple current transformers with a single injected current. In other instances the implementation address the use of multiple electronic devices. Other aspects address mechanisms to combine the injected current with the measured current in a single cable.

Figure 1:
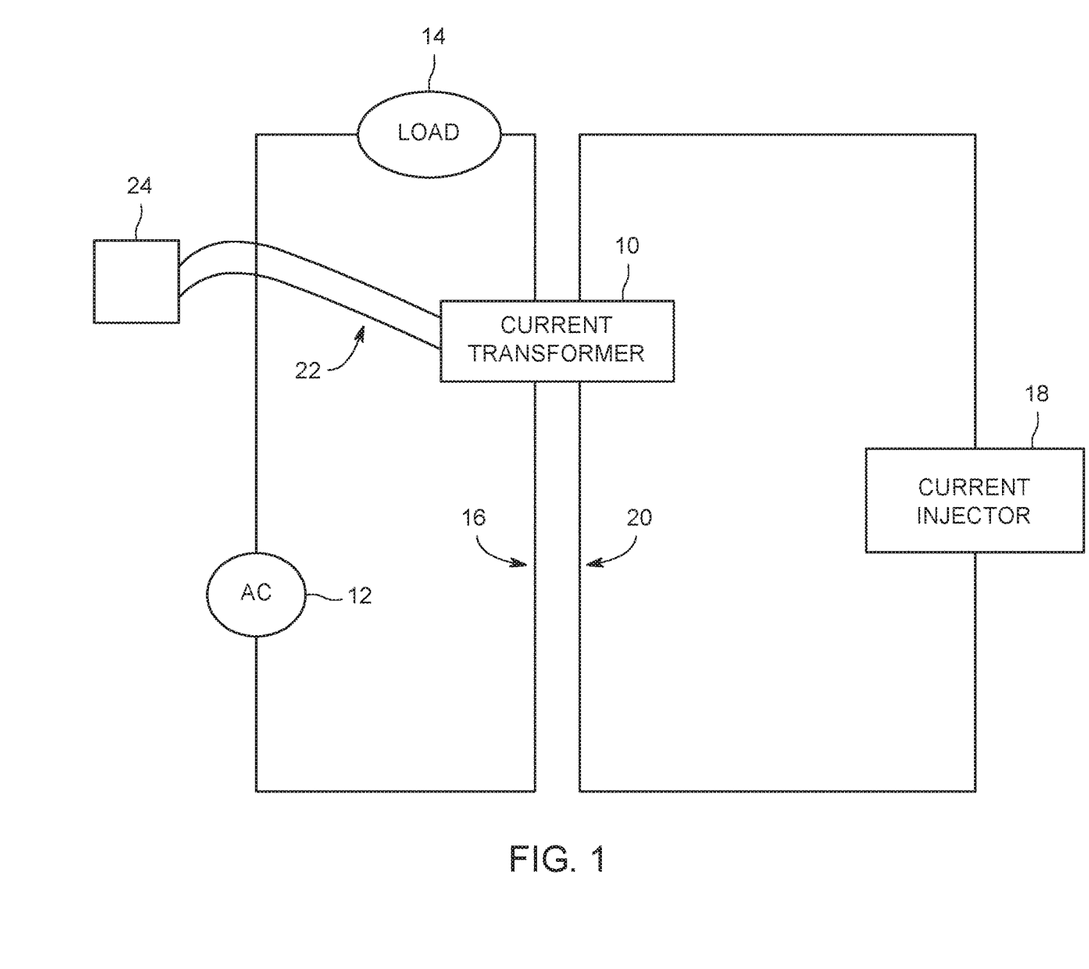
FIG. 1 is a simplified block-diagram of a setup suitable for calibration and compensation of an on-line current transformer, in accordance with aspects of this disclosure.

With the preceding in mind, FIG. 1 illustrates an example of on-line calibration of current transformer 10 during an ongoing measurement operation. In this example, an alternating current power supply 12 drives a load 14 at a specific frequency, with a load cable 16 positioned to pass through the current transformer 10. A current injection system 18 circulates a known AC current through an injection cable 20 at a frequency different from the power supply 12 frequency. The injection cable 20 can pass through the current transformer 10 or be looped around the current transformer 10 with one, two or more windings. A pair of cables 22 is connected to a sense coil in the current transformer 10 and carries the voltage induced in the current transformer 10 to an electronic device 24, which can record voltage data, and/or process the voltage data to provide data for calibration compensation. Since the current injected by the injection system 18 is known, the processed voltage data can be used to determine the load current provided by the power supply 12.

When an AC current flows through the core of the current transformer 10 it causes an oscillating electromagnetic field in the magnetic core of the current transformer 10. This induces an AC voltage in a sense coil around the magnetic core at the frequency of the AC current or one of its harmonics. The simultaneous transmission of AC currents in cables 16 and 20 at two different frequencies induces two superimposed oscillating magnetic fluxes in the magnetic core of the current transformer 10. The voltage induced in the sense coils is a superposition of two different signals at two different frequencies carried by the pair of cables 22. The two components can be separated in the electronic system 24, which may be any suitably programmed processor-based system (e.g., computer or other computing device) or application-specific circuit (e.g., an ASIC) configured or designed to generate calibration data based on the provided inputs.

Figure 2:
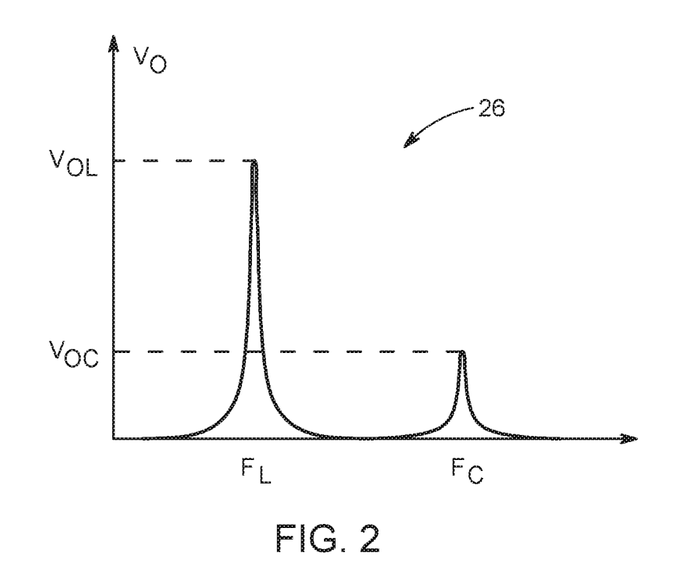
FIG. 2 illustrates via a plot the principle of operation for spectral separation of voltage data, in accordance with aspects of this disclosure.
Figure 3:
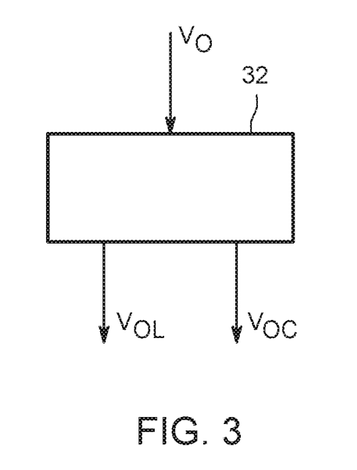
FIG. 3 depicts a digital signal processing implementation for separating an output voltage signal into spectral components, in accordance with aspects of this disclosure.
Figure 4:
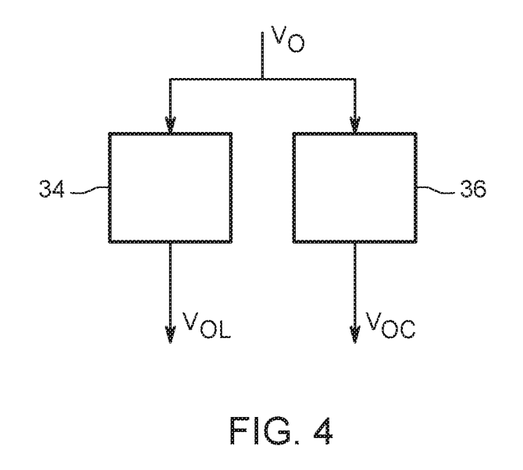
FIG. 4 depicts an analog filter bank implementation for separating an output voltage signal into spectral components, in accordance with aspects of this disclosure.

Turning to FIG. 2, graph 26 represents an idealized spectrum of the superimposed signal $V_O$, illustrates the principle for separation of the signal components. As illustrated, the output voltage $V_O$ has principal components at a load frequency $f_L$ and at a different injected frequency $f_C$. Given the spectral separation between the two signals it is possible to separate the two components using frequency-based filtering. Turning to FIG. 3, in some implementations a digital signal processing system (DSP) 32 configured to perform a spectral filtering method such as Fast Fourier Transform or a Wavelet Transform is employed. As shown in FIG. 4, in other implementations, a bank of analog filters containing a low pass filter 34 and a high pass filter 36 with cutoff frequencies between $f_L$ and $f_C$ is employed. The analog filter bank may also be implemented using bandpass or other conventional analog filters.

Calibration of a current transformer 10 configured as a current sensor, as understood herein, is based on determining the gain g at periodic intervals or when there is an indication of loss of calibration (i.e., "on demand"). The gain for a current transformer 10 is the ratio between the output voltage induced in the sense coil and the input current, i.e., $g=V_O/I$, wherein g is the gain, $V_O$ is the voltage induced in the sense coil and I is the current flowing through the magnetic core of the current transformer 10. Compensation, as understood herein, is the production of the current value from the measured voltage and the gain, as expressed by $I=V_O/g$. Compensation allows accurate determination of the current given a voltage.

In a single frequency system, once the gain g is determined through a calibration, the current can be determined by the compensation. However, the gain g may depend on the frequency of the input current I. The gain calibrated for a given frequency may, therefore, be inadequate for compensation at a different frequency. Therefore, a mechanism that uses two different frequencies, as described herein, may address these effects and allow for adequate compensation.

Figure 5:
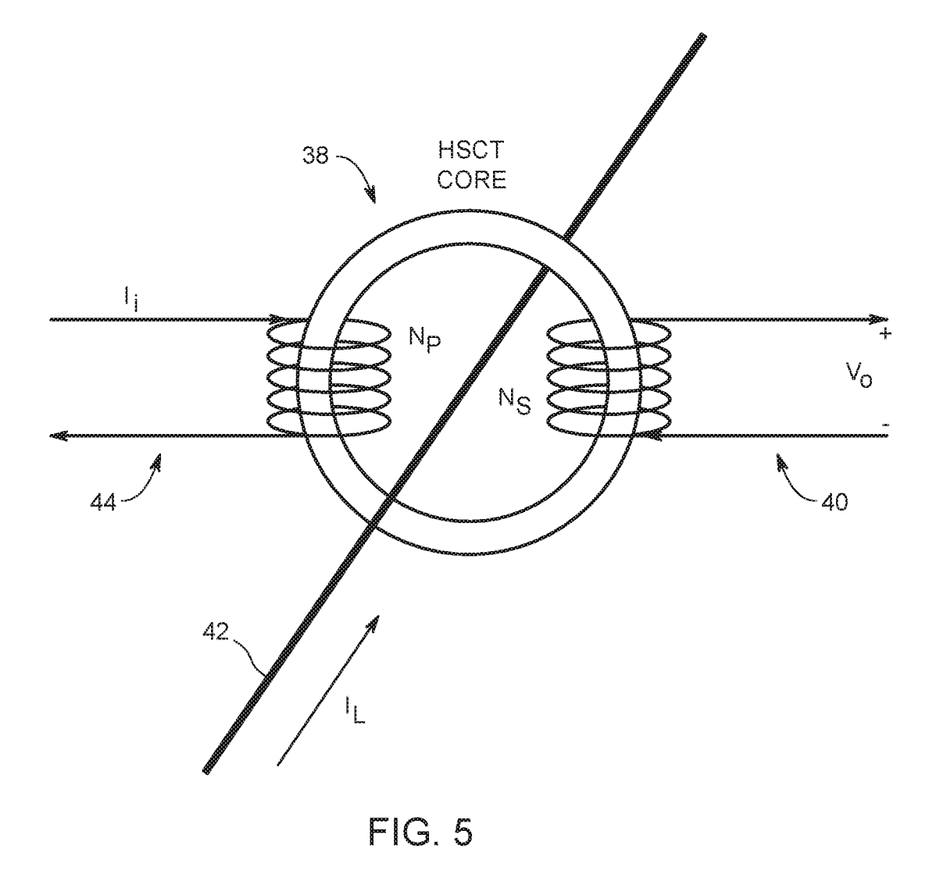
FIG. 5 is a diagram of one implementation illustrating the principle of operation for compensation, in accordance with aspects of this disclosure.

The diagram in FIG. 5 describes how some of the implementations realize this compensation. The magnetic core 38 of the current transformer 10 is equipped with a sense coil 40 that has $N_S$ turns around the magnetic core 38. A load cable 42 carries an AC load current $I_L$ at frequency $f_L$. Additionally, an injection cable 44 carries an AC injection current $I_I$ at different frequency $f_C$. The injection cable 44 has $N_P$ turns around the magnetic core 38 and this number of turns can be as small as $N_P=1$. The load current $I_L$ induces in the sense coil an output voltage $V_{OL}$ and the injected current $I_I$ induces in the sense coil an output voltage $V_{OC}$. Due to the superposition described above, the total output voltage in the sense coil is $V_O=V_{OL}+V_{OC}$. After the separation of the two voltages $V_{OL}$ and $V_{OC}$ through filtering, as described above, one can obtain the calibration at the injected current frequency as $g=V_{OC}/I_I$, in which $I_I$ is known and $V_{OC}$ is measured. The compensation for the measurement of the load current can be obtained by the expression $$I_L = \frac{V_{OL} f_C N_P}{g f_L}, \quad (1)$$

in which $f_C$, $N_P$ and $f_L$ are pre-determined, $V_{OL}$ is measured and g comes from the calibration.

In the preceding examples, the injected current frequency $f_C$ is larger than the load frequency $f_L$. However it is also possible to have the load frequency $f_L$ larger than the injected current frequency $f_C$. Note that the injected current frequency should not be a multiple of the load frequency to avoid interference in the measurements due to harmonics in measurement and/or filtering. Furthermore, the nature of the method for separation of signals described above may prevent separation of frequencies that are too close due to potential spectral overlap in the voltages induced by load currents and injected currents. The compensation scheme described above performs better if the frequency of the injected current is within the linear range of the load current frequency. The linear range is a function of magnetic properties and the geometry of the core of the current transformer. As an example, consider an implementation in which the load current is at frequency at $f_L=50$ Hz. An injected current frequency of $f_L=75$ Hz would be adequate for proper compensation but a frequency of $f_C=1$ kHz would not.

Figure 6:
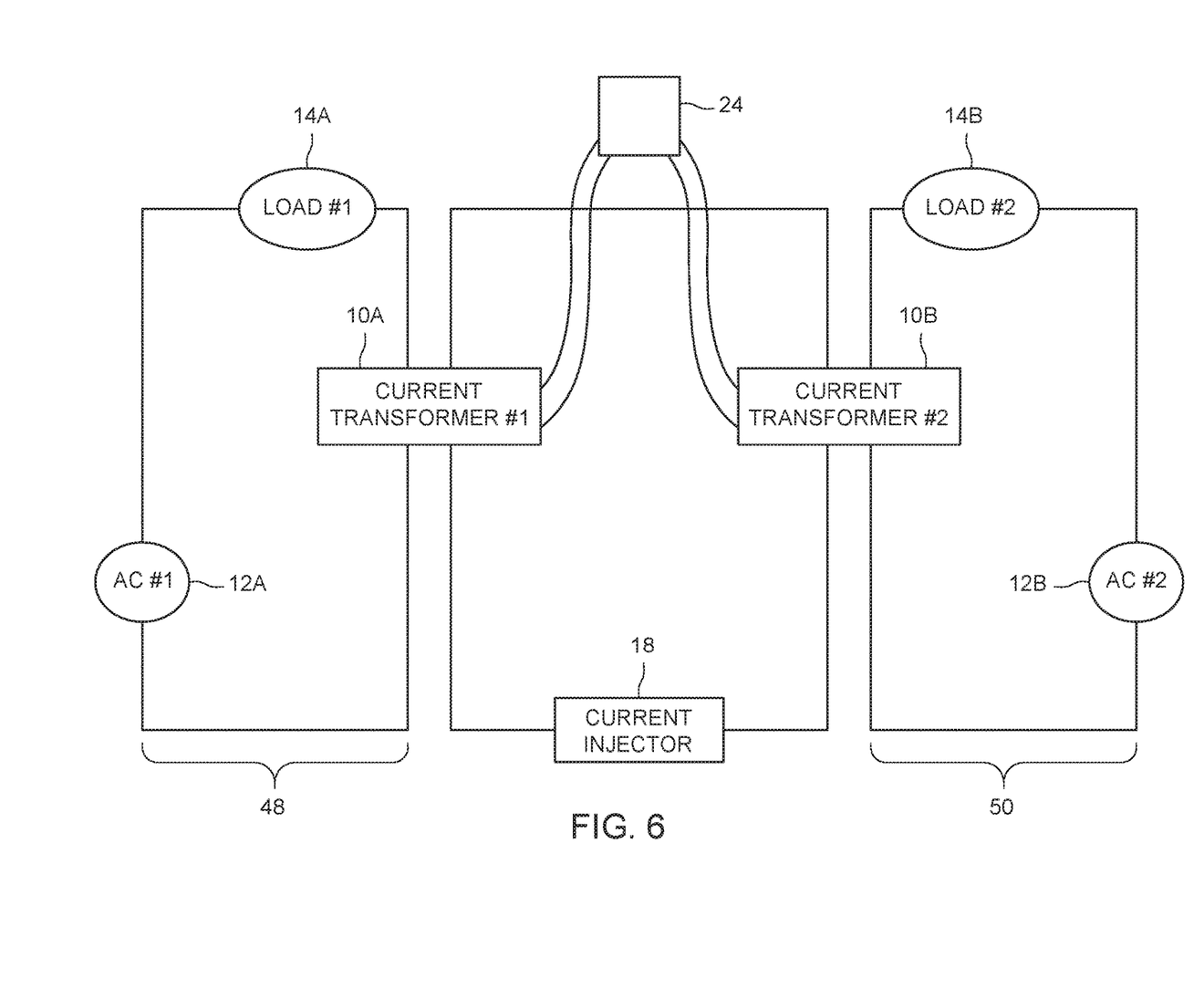
FIG. 6 is a simplified block-diagram of a setup suitable for calibration and compensation of multiple current transformers, in accordance with aspects of this disclosure.

In some implementations, the system is capable of calibrating two separate current transformers 10A, 10B as they measure two different load currents, as illustrated in FIG. 6. The current injector 18 circulates an injected current in a loop circuit going through the magnetic core of two different current transformers 10A, 10B. In addition, the first current transformer 10A is configured to sense the load current going through a first electrical circuit 48 by having a corresponding load cable carrying a load current for circuit 48 pass through the first current transformer 10A. Furthermore, the second current transformer 10B is configured to sense the load current going through a second electric circuit 50 by having a corresponding load cable carrying a load current for circuit 50 pass through the second current transformer 10B. An electronic systems 24 is configured to receive, record and/or process voltage data from the current transformers 10. In other implementations, each current transformer 10 may be supplied with an electronic circuit, instead of sharing it. In further implementations, the calibration system can be used with more than two current transformers 10, such as by having the injected current cable pass through all current transformers 10 to be calibrated.

Figure 7:
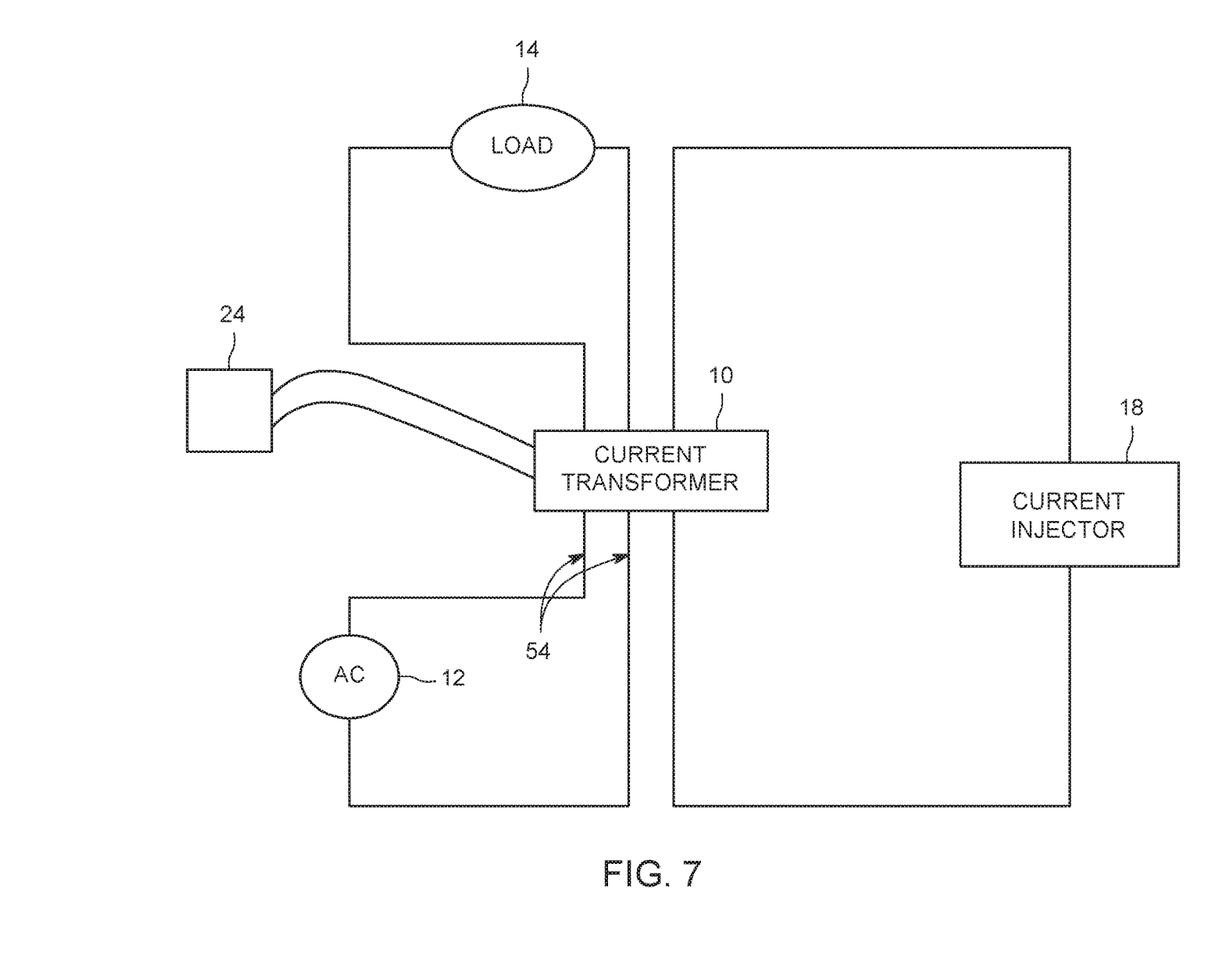
FIG. 7 is a simplified block-diagram of a setup suitable for calibration and compensation of an on-line current transformer configured to measure differential currents, in accordance with aspects of this disclosure.

In some implementations, the calibration system is configured to operate while the current transformer 10 is configured to measure differential currents, as illustrated in FIG. 7. In this example, the pair of load current cables 54 pass through the magnetic core of the current transformer 10 so that their respective currents flow in opposite directions, at a given frequency. In this configuration, the magnetic fluxes from each of the load cables interfere with one another. When the currents in the load cable 54 are identical, the two induced magnetic fluxes cancel each other and the load component of the output voltage in the sense coils becomes $V_{OL}=0$. As the currents deviate from the identity, as may happen when there is leakage current in the load 14, the $V_{OL}$ becomes proportional to the difference in the currents carried by the pair of load cables, providing data about differential currents. The injected current cable also passes through the magnetic core and the current injector 18 flows a current at a different frequency from the one provided by the AC power supply 12. In this configuration, the electronic system 24 is capable of producing differential current data from the voltage data produced, using methods similar to the ones described above. The electronic system 24 will also be able to perform on-line calibration and compensation to provide more accurate measurement of the differential current when present.

Figure 8:
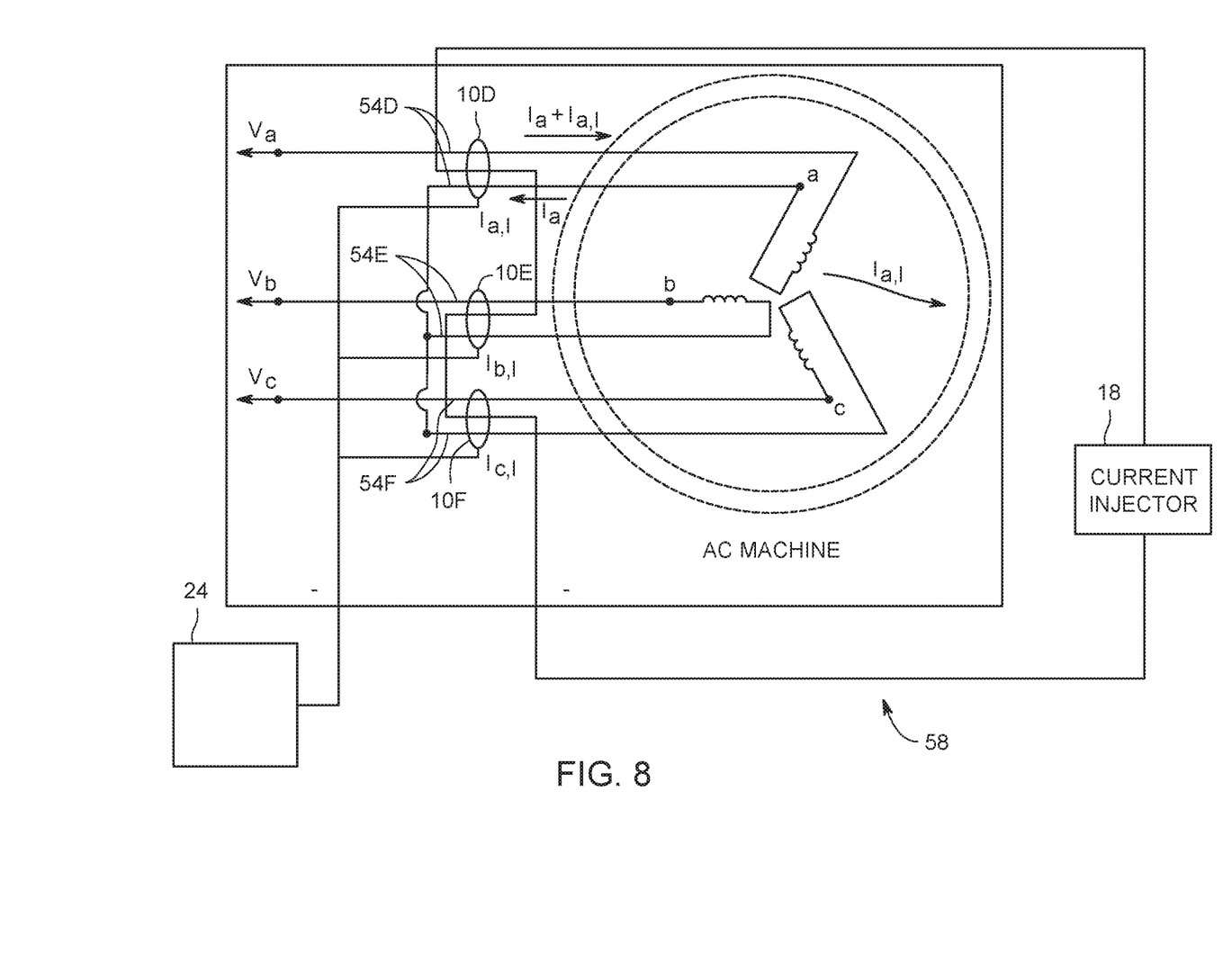
FIG. 8 is a diagram of an application of a calibration and compensation system of current transformers attached to an AC motor, in accordance with aspects of this disclosure.

In some applications, as illustrated in FIG. 8, the calibration system is used in a 3 phase AC motor 58. The three current transformers 10D, 10E and 10F are measuring differential currents from the load cable pairs 54D, 54E and 54F respectively, operating as described above. A current injector 18 flows a known current through the magnetic core of current transformers 10D, 10E and 10F at a frequency different from that of the AC frequency used to drive the AC motor 58. The electronic system 24 is configured to receive and record voltage data induced in the current transformers. In some implementations, the electronic system 24 is configured to compensate measurements of the differential currents, as detailed above.

Figure 9:
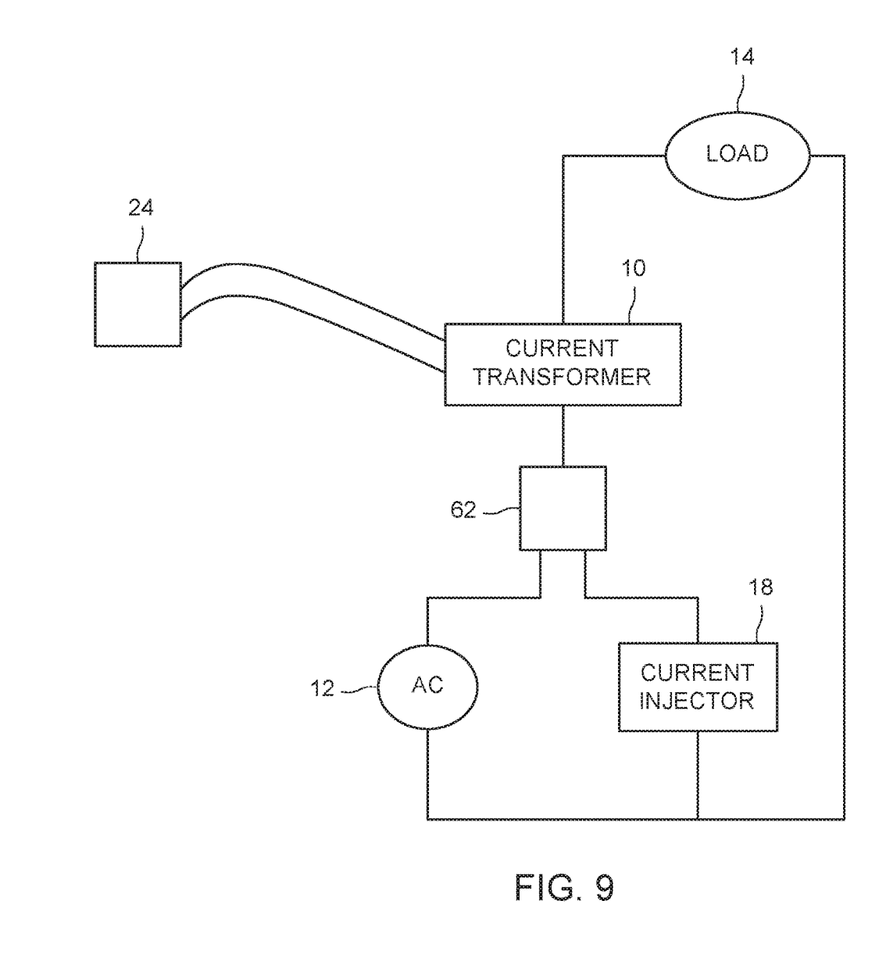
FIG. 9 is a simplified block-diagram of an alternative setup suitable for calibration and compensation of an on-line current transformer, in accordance with aspects of this disclosure.

This specification also contemplates systems in which the injected current travels through the same cable as the load 14 as illustrated in FIG. 9. In such an implementation, the current from the AC power supply 12 is combined with the current from the current injector 18, such as with an adder element 62. In implementations employing this principle, care should be taken to prevent the injected current from interfering with the operation of the load 14.

Technical effects of the invention include the use of a current transformer in AC applications as an accurate current sensor with on-line calibration. The present approach has the advantage of providing accurate from a current transformer over an extended measurement interval without needing to disassemble the setup for recalibration due to recurring calibration being provided in an on-line manner.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method comprising:
    measuring voltage data received from a current transformer, including a magnetic core, while on-line, the voltage data measured by an electronic system including a processor configured to generate calibration data and compensation of differential currents, the electronic system coupled to the current transformer through which a first current $I_L$ at a first frequency $f_L$ and a second current $I_i$ at a second frequency $f_C$ flows, wherein the second current is known and further wherein the second frequency differs from the first frequency and the first current is an AC load current;

separating, by the electronic system, at least two spectral components present in the voltage data;

determining, by the electronic system, a first spectral component $V_{OL}$ associated with the first frequency;

determining, by the electronic system, a second spectral component $V_{OC}$ associated with the second frequency;

calibrating, by the electronic system, a gain g for the current transformer from the known second current and the $V_{OC}$, where $g=V_{OC}/I_i$;

determining, by electronic system, a compensation for a measurement of the first current, where the compensation is determined as:

$$I_L = V_{OL} f_C N_P / gfL$$

where $N_P$ is a number of winding turns of a winding through which the second current flows, and;

providing, by the electronic system, the compensation to the magnetic current transformer, the provision causing the magnetic current transformer to compensate the measurement of the first current with respect to the determined compensation.

2. The method of claim 1, further comprising compensating a measurement of the first current based at least on the calibrated gain.

3. The method of claim 1, wherein the act of separating the at least two spectral components comprises processing the voltage data with a digital signal processor to spectrally separate the voltage data.

4. The method of claim 3, wherein the digital signal processor applies a Fast Fourier Transform to spectrally separate the voltage data.

5. The method of claim 1, wherein the act of separating the at least two spectral components comprises processing the voltage data through an analog filter bank.

6. The method of claim 1, wherein the first current is carried through a pair of load cables.

7. The method of claim 1, wherein the second current is a known injected current generated by a current injector.

8. A method comprising:

measuring a first voltage data received from a first current transformer, including a magnetic core, while on-line, the voltage data measured by an electronic system including a processor configured to generate calibration data and compensation of differential currents, the electronic system coupled to the first magnetic current transformer through which a first AC load current $I_L$ at a first frequency $f_L$ and an AC injected current $I_i$ at a second frequency $f_C$ flows, wherein the injected current is known and the second frequency differs from the first frequency;

measuring a second voltage data received from a second current transformer, including a magnetic core, while on-line, the second voltage data measured by the electronic system coupled to the second magnetic current transformer through which a second AC load current at a third frequency and the injected current flows, wherein the third frequency differs from the second frequency and the third frequency may be equal to the first frequency;

separating, by the electronic system, the plurality of voltage data into spectral components;

determining, by the electronic system, an injected current spectral component $V_{OC}$ associated with the second frequency;

determining, by the electronic system, a first spectral component $V_{OL}$ based on the first frequency from the first voltage data;

determining, by the electronic system, a second spectral component based on the third frequency from the second voltage data;

calibrating, by the electronic system, a gain g from the known AC injected current and the $V_{OC}$, where $g=V_{OC}/I_i$;

determining, by the electronic system, a compensation for a measurement of one or both of the first AC load current or the second AC load current based at least on the calibrated gain;

wherein the first AC load current and the second AC load current are respectively carried through first and second paired load cables; and wherein the compensation is determined as:

$$I_L = V_{OL} f_C N_P / gfL$$

wherein $N_P$ is a number of winding turns of a winding through which the AC injected current flows, and;

providing, by the electronic system, the compensation to the magnetic current transformer, the provision causing the magnetic current transformer to compensate the one or both of the first AC load current or the second AC load current with respect to the determined compensation.

9. The method of claim 8, wherein the act of separating the spectral components comprises processing the voltage data with a digital signal processor to spectrally separate the voltage data.

10. The method of claim 9, wherein the digital signal processor applies a Fast Fourier Transform to spectrally separate the voltage data.

11. The method of claim 9, wherein the digital signal processor applies a Wavelet Transform to spectrally separate the voltage data.

12. The method of claim 8, wherein the act of separating the spectral components comprises processing the voltage data through an analog filter bank.

13. The method of claim 12, wherein the analog filter bank comprises at least a low pass filter and a high pass filter.

* * * * *